United States Patent [19]
Ovshinsky

[11] 3,715,634
[45] Feb. 6, 1973

[54] SWITCHABLE CURRENT CONTROLLING DEVICE WITH INACTIVE MATERIAL DISPERSED IN THE ACTIVE SEMICONDUCTOR MATERIAL

[75] Inventor: Stanford R. Ovshinsky, Bloomfield Hills, Mich.

[73] Assignee: Energy Conversion Devices, Inc., Troy, Mich.

[22] Filed: July 5, 1968

[21] Appl. No.: 742,717

[52] U.S. Cl. ..........................317/234 R, 317/234 V
[51] Int. Cl. ............................................H01l 9/00
[58] Field of Search ..........317/234, 235; 338/20, 21; 252/62 G

[56] References Cited

UNITED STATES PATENTS 2,589,157 3/1952 Stalhane..................................338/21

*Primary Examiner*—Jerry D. Craig
*Attorney*—Wallenstein, Spangenberg, Hattis & Strampel and Edward G. Fiorito

[57] ABSTRACT

A switchable controlling device for an electrical circuit including a semiconductor element and electrodes in low electrical resistance contact therewith, wherein said semiconductor element has a high electrical resistance to provide a blocking condition for substantially blocking current therethrough, wherein the high electrical resistance is substantially instantaneously decreased to a low electrical resistance in response to a voltage above a threshold voltage value, wherein the semiconductor element in the low electrical resistance conducting condition has a voltage drop which is a fraction of the voltage drop in the high electrical resistance blocking condition near the threshold voltage value, and wherein the semiconductor element consists essentially of an active switchable semiconductor material and a relatively inactive material dispersed throughout the active material to add mechanical strength to the semiconductor element and to inhibit migration or diffusion in the active material.

11 Claims, 8 Drawing Figures

Inventor
Stanford R. Ovshinsky
By: Wallenstein, Spangenberg, Hattis & Strampel
attys.

SWITCHABLE CURRENT CONTROLLING DEVICE WITH INACTIVE MATERIAL DISPERSED IN THE ACTIVE SEMICONDUCTOR MATERIAL

The invention of this application is related to and is an improvement upon the invention disclosed in Stanford R. Ovshinsky Pat. No. 3,271,591 issued Sept. 6, 1966. That patent discloses two basic types of current controlling devices, a non-memory type device (referred to therein as a "Mechanism" device) and a memory type device (referred to therein as "Hi-Lo" and "Circuit Breaker" devices). Both the non-memory and memory type devices are changed from their blocking condition to their conducting condition by applying a voltage above a voltage threshold value. The non-memory type device requires a holding current to maintain it in its conducting condition and it immediately returns to its blocking condition when the current decreases below a minimum current holding value. The memory type device requires no holding current, it remaining in its conducting condition even though the current is removed or reversed, and it is returned to its blocking condition by a current pulse of at least a threshold current value. The invention herein is applicable to both types of current controlling devices.

A principal object of this invention is to provide improved switchable current controlling devices for accomplishing the current controlling or switching functions substantially as performed by the current controlling devices of the aforementioned patent but in an improved manner.

The semiconductor elements of the current controlling devices which are engaged by the electrodes, comprise active switchable semiconductor materials which are multi-element or multi-constituent materials and which are often in the form of a thin film or layer thereof between the electrodes. The active switchable semiconductor materials in their blocking condition are substantially disordered and generally amorphous in the memory type devices and, also, preferably in the non-memory type devices. In such non-memory type devices, the active switchable semiconductor materials remain in their substantially disordered and generally amorphous condition when switched to the conducting condition. However, when the memory type devices are switched to their conducting condition, at least one path through the active materials thereof between the electrodes is altered to a more ordered crystalline like condition, but when the current pulse is applied to switch the memory type device back to its blocking condition, the more ordered crystalline like condition of said at least one path in the active material is returned to the substantially disordered and generally amorphous condition.

It has been noted that, in some instances, there has been some shift in the electrical characteristics of the current controlling devices after operation over long intervals of time and particularly where steady voltages and currents have been applied continuously over long intervals of time. Since the operation and switching of the current controlling devices are dependent upon voltage and current conditions which entail high field effects and current densities in the active switchable semiconductor materials between the electrodes, it is believed that due to such field effects and current densities there is a tendency for migration or diffusion in the active materials, such as, for example, migration or diffusion of some of the constituents of the active materials or of atoms or ions in the active materials, and that such tendency seems to be somewhat more pronounced where steady voltages and currents are applied over long intervals of time. Also, the active switchable semiconductor materials, particularly where the semiconductor elements are a thin film or layer having a thickness within the range of about several microns to fractions of a micron, are somewhat fragile in character and subject to cracking or deformation if not handled carefully during the manufacture of the current controlling devices.

In accordance with this invention, the semiconductor elements, in addition to including the active switchable semiconductor material, also have a relatively inactive material which does not substantially chemically react with the active material dispersed throughout the active material between the electrodes. The active switchable semiconductor material may be like those specified in the aforementioned patent. The relatively inactive material which is dispersed throughout the active material may be any suitable relatively inert material, such as, a dielectric, conductor or semiconductor, a dielectric being preferred. A typical example of a dielectric inactive material is aluminum oxide ($Al_2O_3$), it having high mechanical strength and being substantially chemically non-reactive with the active material. The relatively inactive material which is dispersed throughout the active material adds mechanical strength to the semiconductor element and, also, effectively operates to inhibit migration or diffusion in the active material. It also has good thermal properties in terms of dissipating heat buildup. The relatively inactive material establishes tortuous paths through the active material and provides physical barriers throughout the active material against such migration or diffusion. By appropriate selection of the amounts of active material and relatively inactive material and the kind of relatively inactive material (dielectric, conductor or semiconductor) utilized, the initial resistance of the semiconductor element may be increased or decreased as desired.

The semiconductor elements which are engaged by the electrodes may be in the form of thick bodies or they may be in the form of thin layers or films. In making thick body semiconductor elements, the ingredients of the active and relatively inactive materials may be heated in a suitable closed vessel to a condition where the active materials are molten and agitated to evenly disperse the relatively inactive materials throughout the active materials. The mass may then be cooled to form an ingot and desired shapes of semiconductor elements may be cut or otherwise removed from the ingot. Alternatively, semiconductor elements may be cast from the molten mass.

In making thin layers or films, the active and relatively inactive materials may be co-deposited as by co-evaporation, co-sputtering, co-deposition from a fluid, or the like. Where co-evaporation is used, the ingredients of the active material, or an ingot of active material, may be placed in one boat, and the relatively inactive material placed in another and the materials in both boats being simultaneously evaporated in a vacuum to be simultaneously deposited on suitable substrates exposed in vacuum to the vapors. The active switchable semiconductor material of the thin layer or film when so deposited is substantially disordered and generally amorphous and it has dispersed throughout and locked therein the relatively inactive material. By suitably regulating the heat applied to the materials in the respective boats, the molecule size and numbers of molecules of the relatively inactive material dispersed in the active material may be determined. In the typical example referred to above where aluminum oxide ($Al_2 O_3$) is the relatively inactive material, the molecule size can be regulated from ($Al_2 O_3$) to $(Al_2 O_3)_N$, where N can be up to 10 million or more or up to $10^{16}$ corresponding to 10,000 English billion. In this way, the strength of the thin layer or film of the semiconductor element and the inhibiting of the migration or diffusion in the active material may be regulated as desired.

Where the thin layers or films are co-deposited by co-sputtering, the active materials and the relatively inactive materials are separately and simultaneously sputtered on to the substrates in suitable sputtering equipment. By regulating the sputtering of the active material and the relatively inactive material, respectively, the sizes and the numbers of the molecules of the relatively inactive material dispersed in the substantially disordered and generally amorphous thin layer or film of the active material may also be determined to obtain the beneficial results described above in connection with the evaporation process.

Where the thin layers or films are co-deposited by co-deposition from a fluid, the active switchable semiconductor material is contained in a suitable carrier fluid as a solution, colloid, dispersion, or the like, the carrier fluid being in the nature of an ink, paint or the like. The relatively inactive material, such as aluminum oxide ($Al_2 O_3$) or the like, is also contained in the carrier fluid as a solution, colloid, dispersion or the like. The carrier fluid containing the active and relatively inactive materials is applied to a substrate as a thin layer or film by printing, silk screening, painting or the like and is then subjected to drying and/or heating to co-deposit therefrom the active material with the relatively inactive material dispersed throughout the active material.

Other principal objects of this invention reside in the methods of forming the semiconductor element having a relatively inactive material dispersed throughout the active switchable semiconductor material for the purposes herein set forth.

Other objects and advantages of this invention will become apparent to those skilled in the art upon reference to the accompanying specification, claims and drawing in which:

Figures 5, 6, 7:
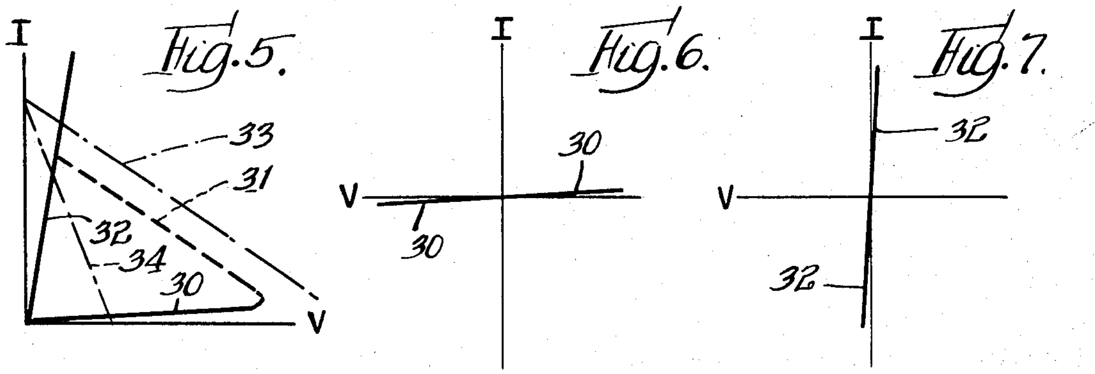
FIG. 5 is a voltage current curve illustrating the operation of the memory type current controlling device of this invention in a D.C. load circuit.
Figure 8:
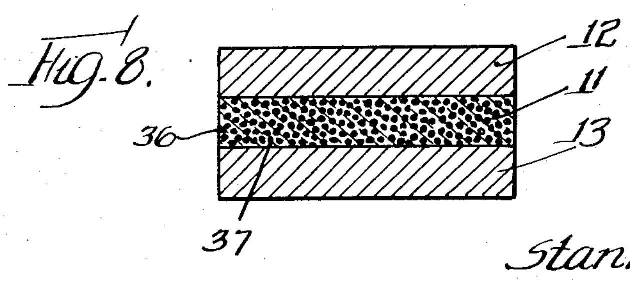

FIGS. 6 and 7 are voltage current curves illustrating the symmetrical operation of the memory type current controlling device and the operation thereof when included in an A.C. load circuit; and FIG. 8 is an enlarged diagrammatic view of the current controlling device showing the semiconductor element as being composed of an active switchable semiconductor material with a relatively inactive material dispersed throughout the active material between the electrodes.

Figure 1:
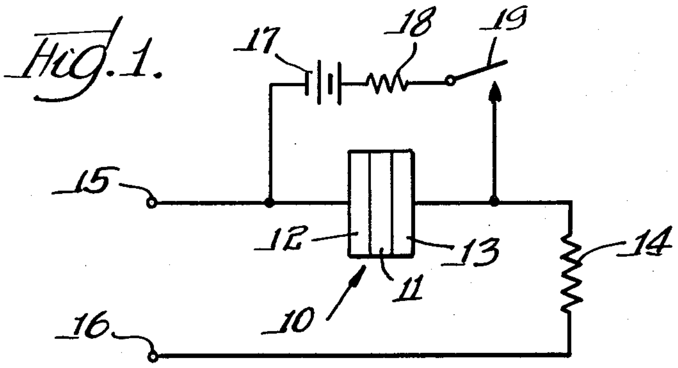
FIG. 1 is a diagrammatic illustration of the current controlling device of this invention connected in series in a load circuit.

Referring now to the diagrammatic illustration of FIG. 1, the switchable current controlling device of this invention is generally designated at 10. It includes a semiconductor element 11 which is of one conductivity type and which is of high electrical resistance and a pair of electrodes 12 and 13 in contact with the semiconductor element 11 and having a low electrical resistance of transition therewith. The electrodes 12 and 13 of the current controlling device 10 connect the same in series in an electrical load circuit having a load 14 and a pair of terminals 15 and 16 for applying power thereto. The power supplied may be a D.C. voltage or an A.C. voltage as desired. The circuit arrangement illustrated in FIG. 1, and as so far described, is applicable for the non-memory type of current controlling device. If a memory type of current controlling device is utilized, the circuit also includes a source of current 17, a low resistance 18 and a switch 19 connected to the electrodes 12 and 13 of the current controlling device. The purpose of this auxiliary circuit is to switch the memory type device from its conducting condition to its blocking condition. The resistance value of the resistance 18 is considerably less than the resistance value of the load 14.

Figures 2, 3, 4:
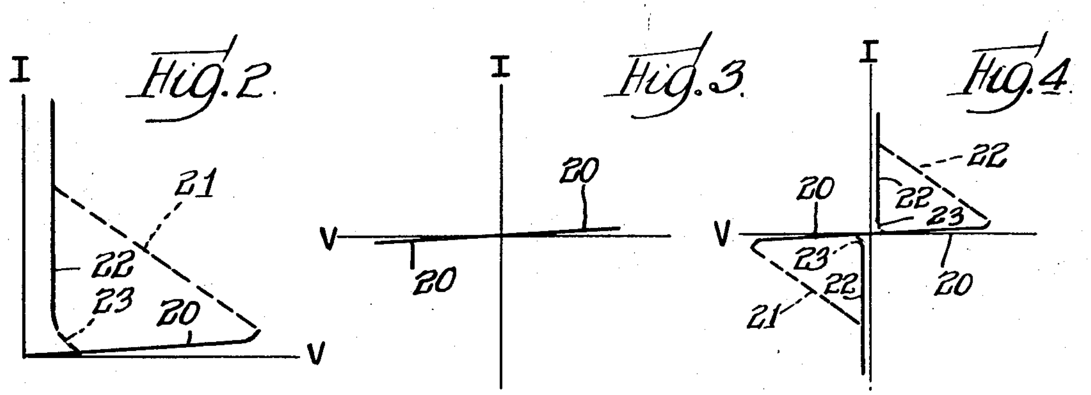
FIG. 2 is a voltage current curve illustrating the operation of the non-memory type current controlling device of this invention in a D.C. load circuit.
FIGS. 3 and 4 are voltage current curves illustrating the symmetrical operation of the non-memory type current controlling device and the operation thereof when included in an A.C. load circuit.

FIG. 2 is an I-V curve illustrating the D.C. operation of the non-memory type current controlling device 10 and in this instance the switch 19 always remains open. The device 10 is normally in its high resistance blocking condition and as the D.C. voltage is applied to the terminals 15 and 16 and increased, the voltage current characteristics of the device are illustrated by the curve 20, the electrical resistance of the device being high and substantially blocking the current flow therethrough. When the voltage is increased to a threshold voltage value, the high electrical resistance in the semiconductor material substantially instantaneously decreases in at least one path between the electrodes 12 and 13 to a low electrical resistance, the substantially instantaneous switching being indicated by the curve 21. This provides a low electrical resistance or conducting condition for conducting current therethrough. The low electrical resistance is many orders of magnitude less than the high electrical resistance. The conducting condition is illustrated by the curve 22 and it is noted that there is a substantially linear voltage current characteristic and a substantially constant voltage characteristic which are the same for increase and decrease in current. In other words, current is conducted at a substantially constant voltage. In the low resistance current conducting condition the semiconductor element has a voltage drop which is a minor fraction of the voltage drop in the high resistance blocking condition near the threshold voltage value.

As the voltage is decreased, the current decreases along the curve 22 and when the current decreases below a minimum current holding value, the low electrical resistance of said at least one path immediately returns to the high electrical resistance as illustrated by the curve 23 to re-establish the high resistance blocking condition. In other words, a current is required to maintain the non-memory type current controlling device in its conducting condition and when the current falls below a minimum current holding value, the low electrical resistance immediately returns to the high electrical resistance.

The non-memory current controlling device 10 of this invention is symmetrical in its operation, it blocking current substantially equally in each direction and it conducting current substantially equally in each direction, and the switching between the blocking and conducting conditions being extremely rapid. In the case of A.C. operation, the voltage current characteristics for the second half cycle of the A.C. current would be in the opposite quadrant from that illustrated in FIG. 2. The A.C. operation of the device is illustrated in FIGS. 3 and 4. FIG. 3 illustrates the device 10 in its blocking condition where the peak voltage of the A.C. voltage is below the threshold voltage value of the device, the blocking condition being illustrated by the curve 20 in both half cycles. When, however, the peak voltage of the applied A.C. voltage increases above the threshold voltage value of the device, the device is substantially instantaneously switched along the curves 21 to the conducting condition illustrated by the curves 22, the device switching during each half cycle of the applied A.C. voltage. As the applied A.C. voltage nears zero so that the current through the device falls below the minimum current holding value, the device switches along the curve 23 from the low electrical resistance condition to the high electrical resistance condition illustrated by the curve 20, this switching occurring near the end of each half cycle.

For a given configuration of the non-memory device 10, the high electrical resistance may be about 1 megohm and the low electrical resistance about 10 ohms, the threshold voltage value may be about 20 volts and the voltage drop across the device in the conducting condition may be less than 1 volt, and the switching times may be in nanoseconds or less. As expressed above, there is no substantial change in phase or physical structure of the non-memory type semiconductor element as it is switched between the blocking and conducting conditions, and where the semiconductor element is substantially disordered and generally amorphous, said at least one conducting path through the semiconductor element is also substantially disordered and generally amorphous in the conducting condition. Where the semiconductor element is substantially more ordered and generally crystalline or polycrystalline, in the manner of having local chemical bonds similar to those of the substantially disordered and generally amorphous semiconductor element, neither is there any substantial change in phase or crystal structure and the added disorder of the buffering relatively inactive material does not impair the operation of the device. Suitable active semiconductor materials for forming the non-memory type current controlling device are set forth in the aforementioned patent and are referred to therein as "Mechanism" type semiconductor materials.

FIG. 5 is an I-V curve illustrating the D.C. operation of the memory type current controlling device 10. The device is normally in its high resistance condition and as the D.C. voltage is applied to the terminals 15 and 16 and increased, the voltage current characteristics of the device are illustrated by the curve 30, the electrical resistance of the device being high and substantially blocking the current flow therethrough. When the voltage is increased to a threshold voltage value, the high electrical resistance in the semiconductor element 11 substantially instantaneously decreases in at least one path between the electrodes 12 and 13 to a low electrical resistance, the substantially instantaneous switching being indicated by the curve 31. The low electrical resistance is many orders of magnitude less than the high electrical resistance. The conducting condition is illustrated by the curve 32 and it is noted that there is a substantially ohmic voltage current characteristic. In other words, current is conducted substantially ohmically as illustrated by the curve 32. In the low resistance current conducting condition the semiconductor material has a voltage drop which is a minor fraction of the voltage drop in the high resistance blocking condition near the threshold voltage value.

As the voltage is decreased, the current decreases along the curve 32 and due to the ohmic relation the current decreases to zero as the voltage decreases to zero. The memory type current controlling device has memory of its conducting condition and will remain in this conducting condition even though the current is decreased to zero or reversed until switched to its blocking condition as hereafter described. The load line of the load circuit is illustrated at 33, it being substantially parallel to the switching curve 31. When a D.C. current is applied independently of the load circuit to the memory type device as by the voltage source 17, low resistance 18 and switch 19 in FIG. 1, the load line for such current is along the line 34 since there is very little, if any, resistance in this control circuit, and as the load line 34 intersects the curve 30, the conducting condition of the device is immediately realtered and switched to its blocking condition. The memory type device will remain in its blocking condition until switched to its conducting condition by the reapplication of a threshold voltage to the device through the terminals 15 and 16.

The memory type current controlling device 10 of this invention is also symmetrical in its operation, it blocking current substantially equally in each direction and it conducting current substantially equally in each direction, and the switching between the blocking and conducting conditions being extremely rapid. In the case of A.C. operation, the voltage current characteristics for the second half cycle of the A.C. current would be in the opposite quadrant from that illustrated in FIG. 5. The A.C. operation of the memory type device is illustrated in FIGS. 6 and 7. FIG. 6 illustrates the device 10 in its blocking condition where the peak voltage of the A.C. voltage is below the threshold voltage value of the device, the blocking condition being illustrated by the curve 30 in both half cycles. Thus, the device blocks current equally in both half cycles. When, however, the peak voltage of the applied A.C. voltage increases above the threshold value of the memory type device, the device substantially instantaneously switches to the conducting condition illustrated by the curve 32 and it remaining in this conducting condition regardless of the reduction of the current to zero or the reversal of the current. This symmetrical conducting condition is illustrated by the curve 32 in FIG. 7.

When the switch 19 is closed and the voltage applied to the terminals 15 and 16 is below the threshold voltage value, the memory type current controlling device is immediately switched to its blocking condition as illustrated by the curve 30 in FIG. 6. For a given configuration of the memory type device, the high electrical resistance may be about 1 megohm and the low electrical resistance about 10 ohms, the threshold voltage value may be about 20 volts and the switching times are extremely rapid. The materials of the semiconductor element 11 of the memory type device may be like those set forth in the aforementioned patent and referred to as "Hi-Lo" and "Circuit Breaker" semiconductor materials. As expressed above, the semiconductor element is substantially disordered and generally amorphous in its blocking condition and said at least one conducting path through the element in its conducting condition is more ordered and generally crystalline, there being a change of phase or physical structure in the material between the blocking condition and the conducting condition.

The foregoing operations of the non-memory device and the memory device are like those disclosed in the aforementioned patent and, therefore, a further description thereof is not considered necessary here.

In accordance with this invention and as expressed above, the active switchable semiconductor materials for the non-memory and memory type semiconductor elements (which may be like those described in the aforementioned patent) have relatively inactive materials dispersed throughout the same for the purposes of adding mechanical strength thereto and inhibiting migration or diffusion. Such semiconductor elements are diagrammatically illustrated on a magnified scale in FIG.8. The active switchable semiconductor material of the semiconductor element 11 is shown in cross-hatched form at 36 and the relatively inactive material dispersed throughout the active material is shown as particles 37 in the active material 36. The particles of relatively inactive material 37 are large in number and of small size, such as within the range specified above, and they form tortuous paths through the active material 36 between the electrodes as illustrated in FIG. 8. The particles of relatively inactive material 37 effectively add mechanical strength to the semiconductor element 11, and they provide physical barriers throughout the active material 36 to block and inhibit migration or diffusion of the constituents of the active material or of atoms or ions in the active material from one electrode to the other. In this way the active semiconductor material 36 is maintained substantially in a uniform condition throughout for the life of the current controlling device without any substantial migration or diffusion, with the result that there is substantially no change in the electrical characteristics of the device during the normal operation life thereof. The particles of relatively inactive material have good thermal properties in terms of dissipation of heat buildup, and by appropriate selection of the amounts and kinds of relatively inactive materials, the initial resistance of the semiconductor element may be increased or decreased as desired. Generally speaking, a dielectric material will provide a higher resistance, a conductive material a lower resistance, and a semiconductive material an intermediate resistance. It is possible that the particles of relatively inactive material dispersed through the active material also provide sharper electric fields in the active material to assist in the switching processes.

While for purposes of illustration one form of this invention has been disclosed, other forms thereof may become apparent to those skilled in the art upon reference to this disclosure and, therefore, this invention is to be limited only by the scope of the apended claims.

I claim:

1. A switchable current controlling device for an electrical circuit including a semiconductor element and electrodes in low electrical resistance contact therewith, wherein said semiconductor element has a relatively high electrical resistance to provide a blocking condition for substantially blocking current therethrough, and has means for substantially instantaneously decreasing said relatively high electrical resistance in response to a voltage above a threshold voltage value in at least one path between the electrodes to a relatively low electrical resistance which is orders of magnitude lower than the relatively high electrical resistance to provide a conducting condition for substantially conducting current therethrough, the improvement wherein said semiconductor element consists essentially of a solid substantially disordered and generally amorphous active switchable semiconductor material and particles of a relatively inactive material which does not substantially chemically react with the active material embedded in and dispersed throughout the active material.

2. A current controlling device as defined in claim 1 wherein said active switchable semiconductor material has means for providing a substantially more ordered crystalline line condition in said at least one path in its conducting condition.

3. A current controlling device as defined in claim 2 wherein said device is a memory type device and said semiconductor element has means for maintaining said at least one path through said semiconductor element its relatively low electrical resistance conducting condition even in the absence of current, and for realtering said relatively low electrical resistance conducting condition of said at least one path through the semiconductor element to said relatively high electrical resistance blocking condition in response to a current pulse of at least a threshold value.

4. A current controlling device as defined in claim 1 wherein said device is a memory type device and said semiconductor element has means for maintaining said at least one path through said semiconductor element in its relatively low electrical resistance conducting condition even in the absence of current, and for realtering said relatively low electrical resistance conducting condition of said at least one path through the semiconductor element to said high electrical resistance blocking condition in response to a current pulse of at least a threshold value.

5. A current controlling device as defined in claim 1 wherein said device is a non-memory type device and said semiconductor element has means for immediately returning said relatively low electrical resistance of said at least one path through said semiconductor element in the conducting condition to the relatively high electrical resistance in response to a decease in current below a minimum current holding value which re-establishes the blocking condition.

6. A current controlling device as defined in claim 1 wherein said particles of relatively inactive material which are embedded in and dispersed throughout said active material are substantially a dielectric.

7. A current controlling device as defined in claim 6 wherein said particles of inactive material comprise aluminum oxide.

8. A current controlling device as defined in claim 1 wherein said semiconductor element comprises a deposited thin film.

9. A current controlling device as defined in claim 8 wherein said deposited thin film of said semiconductor element is formed by co-evaporation of said active switchable semiconductor material and said relatively inactive material.

10. A current controlling device as defined in claim 8 wherein said deposited thin film of said semiconductor element is formed by co-sputtering of said active switchable semiconductor material and said relatively inactive material.

11. A current controlling device as defined in claim 8 wherein said deposited thin film of said semiconductor element is formed by co-deposition from a fluid carrier of said active switchable semiconductor material and said relatively inactive material.

* * * * *